United States Patent
Bang

(10) Patent No.: US 8,207,569 B2
(45) Date of Patent: Jun. 26, 2012

(54) INTERTWINED FINGER CAPACITORS

(75) Inventor: David Bang, La Jolla, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 704 days.

(21) Appl. No.: 11/758,763

(22) Filed: Jun. 6, 2007

(65) Prior Publication Data

US 2008/0304205 A1      Dec. 11, 2008

(51) Int. Cl.
*H01L 27/107*      (2006.01)
(52) U.S. Cl. .. 257/307; 257/308; 257/312; 257/E27.071
(58) Field of Classification Search ............ 257/307, 257/308, 312, E27.071
See application file for complete search history.

(56) References Cited

U.S. PATENT DOCUMENTS

| | | | |
|---|---|---|---|
| 6,385,033 B1 | 5/2002 | Javanifard et al. | |
| 7,561,407 B1 * | 7/2009 | Chen et al. | 361/306.1 |
| 2006/0006496 A1 | 1/2006 | Harris et al. | |
| 2008/0012092 A1 * | 1/2008 | Liang et al. | 257/532 |

FOREIGN PATENT DOCUMENTS

WO   WO2007006729 A1   1/2007

OTHER PUBLICATIONS

International Search Report and Written Opinion—PCT/US2008/064983, International Search Authority—European Patent Office—Sep. 25, 2008.

* cited by examiner

*Primary Examiner* — Tan N Tran
(74) *Attorney, Agent, or Firm* — Donald C. Kordich; William M. Hooks

(57) ABSTRACT

Capacitive structures in integrated circuits are disclosed. The capacitive structures are formed on a substrate. Each capacitive structure includes a first conductive finger and a second conductive finger. The first and second conductive fingers are arranged in parallel with each other and separated from each other by a dielectric material. The first finger is connected to a first interconnect and the second conductive finger is connected to a second interconnect. A first capacitor is formed from a first group of the plurality of capacitive structures having respective interconnects coupled together. A second capacitor is formed from a second group of the plurality of capacitive structures having respective interconnects coupled together. The capacitive structures of the first group are intertwined with the capacitive structures of the second group.

19 Claims, 5 Drawing Sheets

| A1 | ε | B1 | ε | A2 | ε | C1 | ε | D1 | ε | C2 | ε | A3 | ε | B2 | ε | A4 | ε | C3 | ε | D2 | ε | C4 |
|----|---|----|---|----|---|----|---|----|---|----|---|----|---|----|---|----|---|----|---|----|---|----|
| A1 | ε | B1 | ε | A2 | ε | C1 | ε | D1 | ε | C2 | ε | A3 | ε | B2 | ε | A4 | ε | C3 | ε | D2 | ε | C4 |

| C1-A | C2-A | C1-B | C2-B | C1-C | C2-C | ... |
|------|------|------|------|------|------|-----|

| C1-A | C2-A | C1-B | C2-B | C1-C | C1-D | C2-C | C2-D | ... |
|------|------|------|------|------|------|------|------|-----| ations for making capacitors having conductive fingers.

INTERTWINED FINGER CAPACITORS

FIELD OF THE DISCLOSURE

This description relates to intertwined capacitors, and more particularly to matched pairs of intertwined capacitors formed on a semiconductor substrate.

BACKGROUND

Capacitors are important components of integrated circuits. A typical capacitor formed on a semiconductor substrate includes first and second conductive layers/elements separated by a thin dielectric film. In many circuits, a capacitor is formed by forming banks of different capacitors which are then combined to form larger capacitors which match each other, e.g., two larger capacitors that each include banks of smaller capacitors. The combination of banks of smaller capacitors is intended to average out systemic variations across the entire semiconductor structure.

For example, if photolithographic processes are used to fabricate the wafer by forming patterns in the wafer layers, the photoresist is selectively exposed to light through an optical mask bearing the desired pattern. The exposed photoresist can then be selectively removed in order to generate a pattern in the substrate having features that, in the ideal case, exactly duplicate those of the optical mask. Subsequent etch or deposition of the substrate can then be performed in those areas where the photo-resist has been removed. However, processing errors are encountered during one or more of the steps in the fabrication of the wafer. For example, contaminations during the fabrication of photomasks, embedded impurities in substrates, resists, or other involved materials, may give rise to defects in the pattern(s) after the patterning process. In addition, the mask may have inherent defects which result in inconsistencies in the resulting pattern(s) created on the wafer.

One conventional technique for forming capacitors is to use interdigital, or interdigitated capacitive plates or "fingers." The interdigitated fingers permit large scale integration of numerous capacitors on a common semiconductor substrate. However, inherent lens and/or center edge bias may introduce mismatches between larger capacitor pairs. For example, dimensional variations may occur across the surface of the wafer which lead to variations in the capacitance of individual capacitors formed on the substrate, e.g., inconsistencies with respect to the length, width, and thickness of the substrate. Accordingly, the capacitance of a capacitor formed at a first location on the substrate may deviate substantially from the capacitance of a second capacitor formed at a second location on the substrate.

Referring to FIG. 1, an interdigitated capacitor arrangement 100 on a semiconductor substrate can effectively utilize available space on the substrate. The capacitor arrangement 100 includes a first conductive structure and a second conductive structure. The first conductive structure includes an interconnect region 110 which extends laterally with respect to the semiconductor substrate, e.g., from left to right in FIG. 1 and lengthwise with respect to the substrate on which the structure is formed. The first conductive structure also includes a plurality of conductive fingers 115a-b which extend generally perpendicular to and away from the interconnect region 110, e.g., vertically in FIG. 1.

The second conductive structure includes an interconnect 120 and a plurality of conductive fingers 125a-c. As seen in FIG. 1, the fingers 125a-c also extend perpendicular to, and away from, the respective interconnect 120. In addition, the fingers 125a-c are interdigitated with the fingers 115a-b to form a capacitor array between the first and second conductive structures. An insulating material 130 acts as a dielectric between the capacitors formed by each pair of parallel, but opposite fingers 125a, 115a, etc. on the substrate.

The relatively long conductors or "fingers" 115a-b, 125a-c may provide coupling between input and output ports, or transistors (not shown, but which may be connected with the interconnects), across gaps ($G_F$, $G_E$) formed between the respective fingers 115a-b, 125a-c. Conventionally, the gaps ($G_F$) between the fingers 115a-b, 125a-c and at the end of the fingers ($G_E$) are the same. The length (L) and width (W) of the fingers will affect the capacitance of the capacitor array, e.g., by increasing or decreasing the effective area of the capacitor plates, e.g., fingers. In addition, since the conductors are mounted on a substrate, the characteristics of the substrate will also affect capacitance. For example, the variations of the dielectric constant ($\in r$) of the insulating material will impact the electrical characteristics. In addition, the thickness of the conductors, e.g., "W" in FIG. 1 and the resistivity ($\rho$) of the conductive material deposited on the substrate will also impact the electrical characteristics.

Accordingly, the capacitance of the interdigitated capacitor arrangement 100 may be varied in numerous ways. In general, an increase in capacitance is obtained by increasing the resulting area of the capacitor plates/fingers, e.g., increasing the length L of the conductors, and/or the depth of the conductors. Increasing the number of fingers and length of fingers increase the width and length, respectively, of the capacitor and required substrate. The design objectives are generally to provide the desired capacitance at the design frequency in a reasonable area. With respect to the gaps $G_E$, $G_F$, the capacitance generally increases as the gaps are decreased, but a minimum gap is conventionally limited by the smallest, repeatable gap achievable during fabrication. Reducing the width of the fingers in general reduces the required area, increases the characteristic impedance of the line, and lowers the effective capacitance.

Referring to FIG. 2, a conventional arrangement is illustrated that is used to address process variations and to produce matching capacitors. Banks of capacitors from different layout locations are connected to average out systemic variations occurring with respect to the span of the wafer, e.g., along the length of the substrate L as depicted in FIG. 2. Two capacitors are formed. A first capacitor is formed from capacitor 1A (Cap 1A) and capacitor 1B (Cap 1B). A second capacitor is formed from capacitor 2A (Cap 2A) and capacitor 2B (Cap 2B). Capacitors 1A and 1B, and capacitors 2A and 2B are located in adjacent corners of the area allocated for the capacitor banks and interconnected (e.g., cross connected) to average out system variations occurring with respect to the span L of the wafer. Individual capacitors 1A, 1B, 2A, and 2B may each include a capacitor array, such as that shown in FIG. 1. Further, the span L can be 100's of micron's long, which is large enough to see systemic lens and within die variations, which are not compensated by the simple cross connection of the capacitors (1A, 1B, 2A and 2B). Accordingly, the first and second capacitors may still not be accurately matched.

SUMMARY

Exemplary embodiments of the invention are directed to capacitive structures and methods for making capacitors having conductive fingers.

Accordingly, an embodiment of the invention can include an integrated circuit having a plurality of capacitive structures formed on a substrate. Each capacitive structure includes a first conductive finger and a second conductive finger. The first and second conductive fingers are arranged in parallel with each other and separated from each other by a dielectric material. The first finger is connected to a first interconnect and the second conductive finger is connected to a second interconnect. A first capacitor is formed from a first group of the plurality of capacitive structures having common interconnects. A second capacitor is formed from a second group of the plurality of capacitive structures having common interconnects. The capacitive structures of the first group are intertwined with the capacitive structures of the second group.

Another embodiment of the invention can include a capacitive structure having a first capacitor and a second capacitor arrangement. The first capacitor arrangement includes a first bus having fingers extending towards a centerline of the semiconductor structure and a second bus having fingers extending towards the centerline of the semiconductor structure. The first bus and the second bus extend substantially parallel to one another and the fingers of the first bus and the fingers of the second bus are alternately interleaved with one another. The second capacitor arrangement includes a third bus having fingers extending towards the centerline of the semiconductor structure and a fourth bus having fingers extending towards the centerline of the semiconductor structure. The third bus and the fourth bus extend substantially parallel to one another. The fingers of the third bus and the fingers of the fourth bus are alternately interleaved with one another and the fingers of the first capacitor arrangement are alternately intertwined with fingers of the second capacitor arrangement.

Another embodiment of the invention can include a method for making capacitors. The method includes forming a plurality of capacitive structures on a substrate. Each capacitive structure includes a first conductive finger, and a second conductive finger, wherein the first and second conductive fingers are arranged in parallel with each other and separated from each other by a dielectric material and wherein the first finger is connected to a first interconnect and the second conductive finger is connected to a second interconnect. A first capacitor is formed from a first group of the plurality of capacitive structures having respective interconnects coupled together. A second capacitor is formed from a second group of the plurality of capacitive structures having respective interconnects coupled together. The capacitive structures of the first group are intertwined with the capacitive structures of the second group.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

Figure 1:
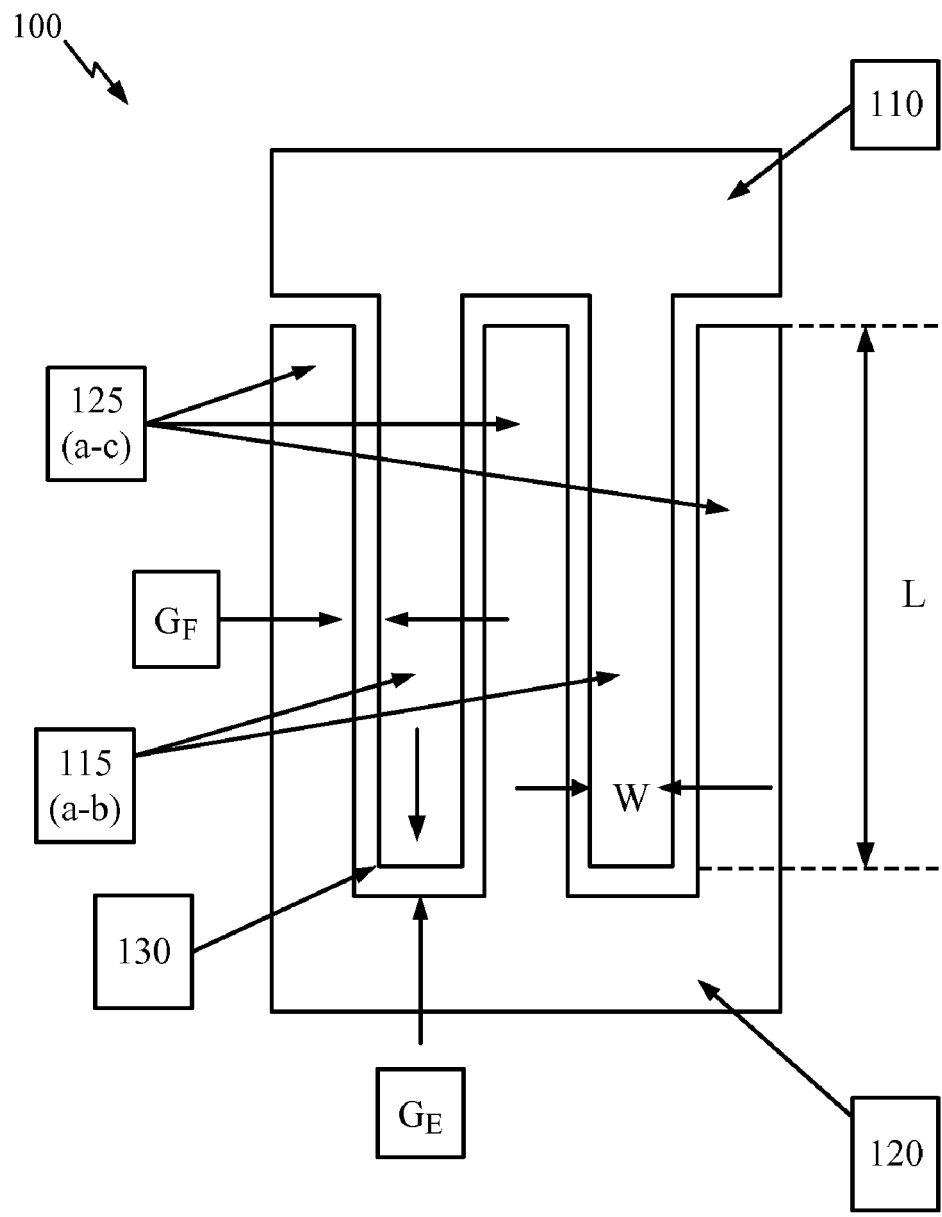
FIG. 1 is a schematic view of a substrate incorporating an interdigitated array of capacitors.
Figure 2:
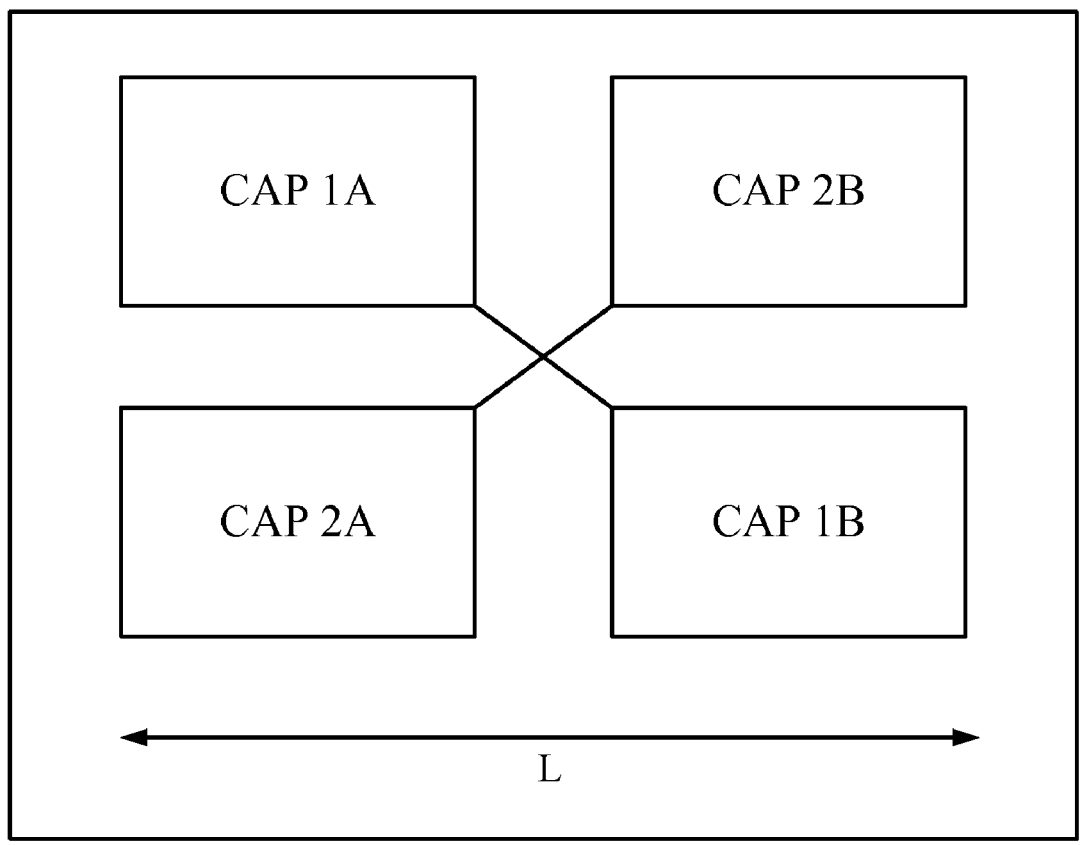
FIG. 2 is a schematic view of a conventional matched capacitor pair in a cross connected configuration.
Figure 3:
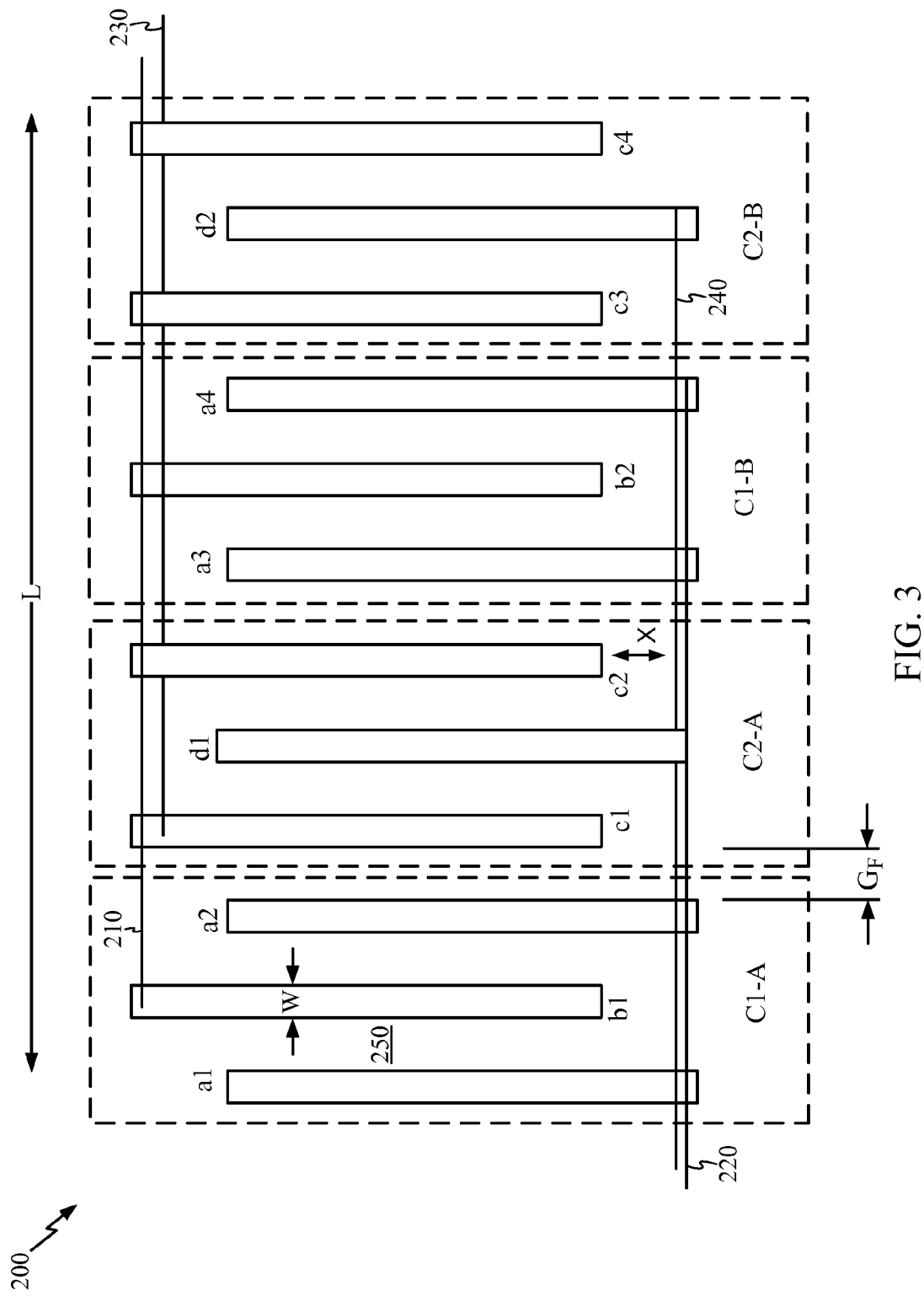
FIG. 3 is a schematic view of an array of intertwined capacitors formed of conductive fingers.

As discussed in the background, variations in the formation (e.g., lens, mask, etching) and materials (e.g., dielectric properties of the substrate) can lead to substantial mismatches in capacitors that are formed in arrays on a substrate. To compensate for this variation, embodiments of the invention provide an intertwined design, where each finger is scaled, so that systemic lens and intra-die variations are averaged out across the structure. Instead of combining banks of capacitors from different layout locations as used in conventional designs, the individual fingers of each capacitor are intertwined in order to average out any systemic variations. For example, as illustrated in FIG. 3, a capacitive structure 200 formed on a semiconductor substrate includes a first capacitive structure C1-A, a second capacitive structure C2-A, a third capacitive structure C1-B, and a fourth capacitive structure C2-B that are intertwined with each other. As used herein the term intertwining generally refers to an alternating pattern of capacitive structures (e.g., C1-A, C2-A) of each capacitor (e.g., C1, C2).

Referring to FIG. 3, the first capacitive structure C1-A includes interconnects 210 and 220 with a plurality of conductive fingers (a1, a2) extending perpendicular to, and away from, the interconnect 220 and a conductive finger (b1) extending perpendicular to, and away from, the interconnect 210. The second capacitive structure C2-A includes interconnects 230 and 240 with a plurality of conductive fingers (c1, c2) extending perpendicular to, and away from, the interconnect 230 and a conductive finger (d1) extending perpendicular to, and away from, the interconnect 240. The third capacitive structure C1-B includes the interconnects 210 and 220 with a plurality of conductive fingers (a3, a4) extending perpendicular to, and away from, the interconnect 220 and a conductive finger (b2) extending perpendicular to, and away from, the interconnect 210. The fourth capacitive structure C2-B includes the interconnects 230 and 240 with a plurality of conductive fingers (c3, c4) extending perpendicular to, and away from, the interconnect 230 and a conductive finger (d2) extending perpendicular to, and away from, the interconnect 240. As will be appreciated from FIG. 3, the conductive fingers (a1-4, b1-2, c1-4, and d1-2) are arranged substantially in parallel with each other and generally perpendicular to, the interconnects 210, 220, 230, and 240. However, embodiments of the invention are not limited to this configuration and any arrangement of the interconnects with respect to the fingers that provides connection to the appropriate fingers may be implemented.

An insulating material 250 on the substrate forms a dielectric between the conductive fingers and interconnects. In alternate embodiments the insulating/dielectric material 250 can be the substrate itself. The plurality of fingers and dielectric form capacitive structures C1-A, C2-A, C1-B and C2-B, as described above. The capacitive structures C1-A and C1-B are intertwined with the capacitive structures C2-A and C2-B. Any systemic variations in the capacitive structures C1-A, C2-A, C1-B and C2-B, such as those caused by inconsistencies in geometry related to the individual die, lens effect, mask deviation, for example, are averaged out across the span (L) of the capacitive structure 200. For example, each finger (e.g., a1, b1, etc.) can be less than one micron wide, so that systemic lens and within die variations are averaged out across the structure 200. However, other dimensional values can be used which are appropriate to the particular scale (e.g., 90 nm, 65 nm, 45 nm), material and processes used in forming the structures. In addition, parasitic capacitance between fingers (e.g., a2 and c1) may be controlled by varying the finger gap $G_F$ between fingers of each capacitive structure (e.g., C1-A, C2-A), such as the gap between a2 and c1. Further, the parasitic capacitance between the fingers and interconnect (or bus) can be controlled by adjusting the end gap X between the finger (e.g., c2) and interconnect 240.

The interconnects (or bus) 210, 220, 230, and 240 are conductive elements, such as thin metallic wires deposited or otherwise formed on the substrate. The interconnects 210, 220, 230, and 240 are electrically connected to the respective fingers, but are not connected to neighboring fingers from other conductive structures. For example, the interconnect 210 is electrically connected to only fingers a1-a4. Accordingly, although depicted schematically in FIG. 3 as extending laterally across the span of the substrate, the individual interconnects can be formed on multiple layers of the substrate, e.g., at various depths with respect to the fingers and/or one another. Accordingly, the interconnects 210 and 220 may be electrically connected to the respective fingers and be deposited on a first layer of the substrate. The interconnects 230 and 240 may be electrically connected to respective fingers C1-C4, and d1-d2 and at a lower or higher depth with respect to the interconnects 210 and 220.

Figure 4:
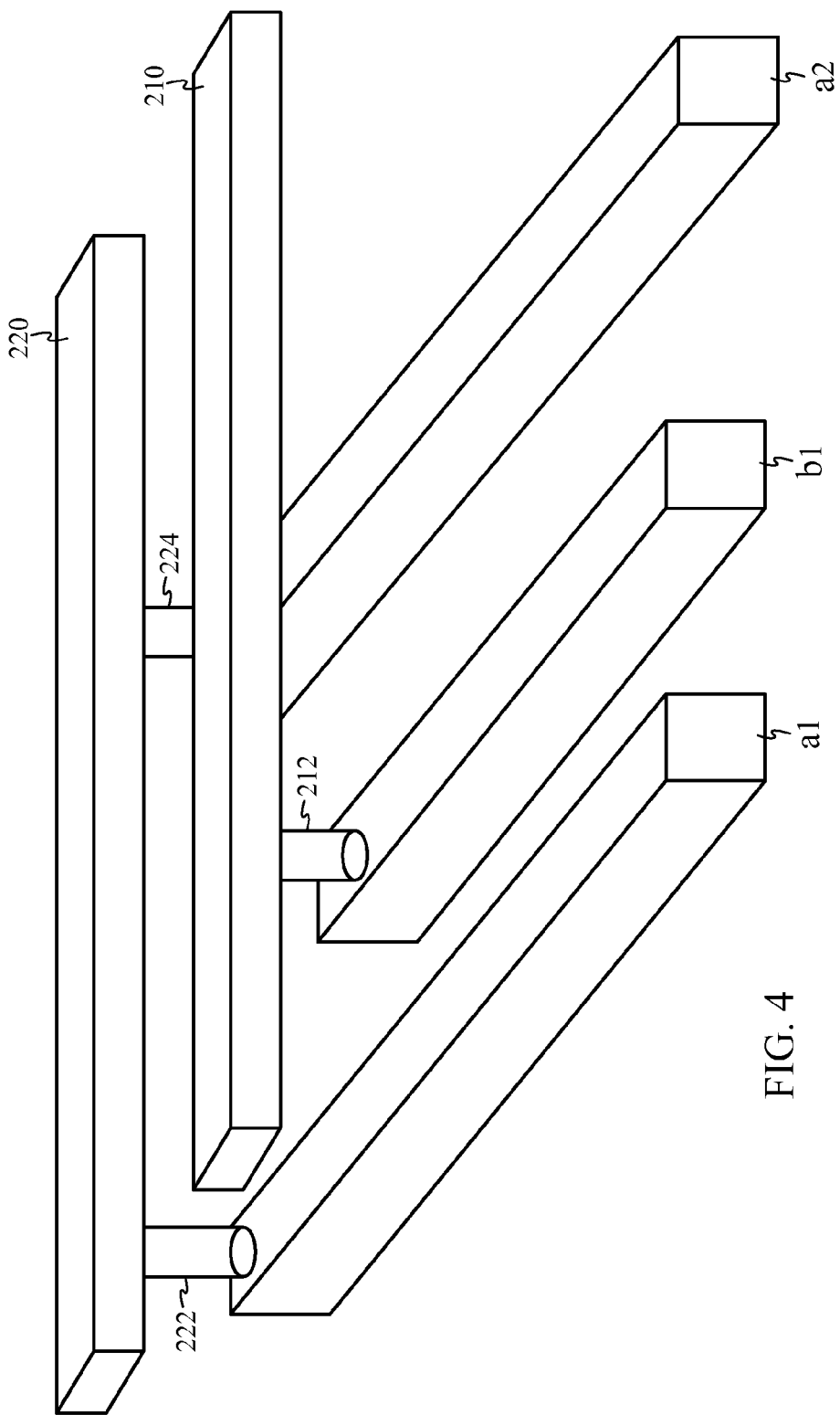
FIG. 4 is a three-dimensional view of a interconnects and conductive fingers.

For example, referring to FIG. 4, a three-dimensional illustration of the interconnects in relation to the fingers is provided. Interconnect 210 and 220 are illustrated above the fingers a1, b1, and a2. Interconnects 210 and 220 run substantially parallel to each other and substantially perpendicular to fingers a1, b1, and a2. Interconnects 210 and 220 are connected to the fingers by conductors 212, 222 and 224, respectively. Also, as illustrated interconnects 210 and 220 are formed on the same end of the fingers. However, embodiments can include interconnects at various locations relative to the fingers and each other. For example, the interconnects may be formed on various layers in different combinations. Further, one or more of the interconnects may be routed on the same layer as the fingers in a path that avoids contact with neighboring interconnects and fingers from another conductive structure, e.g., in a stepped wave pattern which avoids contact with adjacent fingers or interconnects. Accordingly, embodiments of the invention are not limited to the arrangements illustrated.

The dielectric material 250 can be formed of any known dielectric material, such as, silicon dioxide, porous silicon dioxide with carbon doping, silicon nitride, silicon carbide, titanium oxide, for example. Likewise, the conductive fingers and interconnects can be formed of any conductive material, such as copper or aluminum, for example. While the substrate on which the capacitor 200 is formed may be several hundred microns in length, the individual capacitive structures may be formed of fingers having a width, W of less than 1 micron, e.g., 70-100 nm wide, and with lengths of several microns long (e.g., >15), microns long. While the interconnects are depicted schematically in FIG. 3 as being thinner than the corresponding fingers, the width of the fingers and the width of the interconnects may be sized to any appropriate width to facilitate conduction between the fingers. Accordingly, the dimensions discussed and the dimensional relationships illustrated are provided merely to facilitate a discussion of embodiments of the invention and should not be construed as limiting embodiments of the invention to any specific materials, dimensional values, and/or dimensional relationships.

Referring back to FIG. 3, the first and second capacitor may be formed of intertwined capacitive structures C1-A, C2-A, C1B, C2-B and additional intertwined capacitive structures not expressly illustrated. Each capacitor can have capacitances ranging from the picofarad to femtofarad range. Only two match capacitors are illustrated in FIG. 3. However, additional capacitors can be added by intertwining additional capacitive structures connected to additional interconnects. Further, embodiments of the invention are not limited to the intertwining as shown, which illustrates alternating capacitive structures (i.e., every other capacitive structure is coupled to form one capacitor). Embodiments of the invention can include intertwining patterns that may have an arbitrary number of capacitive structures and/or fingers for one capacitor arranged contiguously before being intertwined with similar elements of another capacitor. Further, the level of intertwining may be varied, for example a one to one level of intertwining may be used in areas where the process/substrate variation is expected to be high and less intertwining (i.e., more fingers of the same capacitor arranged adjacent to each other) may be used in areas where the variation is expected to be less or where it would be beneficial for connections to other components, routing and the like.

It will be appreciated from the foregoing that the embodiments of the invention are not limited to the illustrated example of FIG. 3. For example, as discussed above the number of fingers per capacitive structure is not limited to the three fingers illustrated and may have two or more fingers. Accordingly, an embodiment of the invention can include an integrated circuit having a plurality of capacitive structures (e.g., C1-A, C2-A) formed on a substrate. Each capacitive structure includes a first conductive finger (e.g., a1) and a second conductive finger (e.g., b1). The first and second conductive fingers are arranged in parallel with each other and separated from each other by a dielectric material 250. The first finger is connected to a first interconnect (e.g., 220) and the second conductive finger is connected to a second interconnect (e.g., 210). A first capacitor is formed from a first group (e.g., C1-A, B) of the plurality of capacitive structures having common interconnects (e.g., 210, 220). A second capacitor is formed from a second group (e.g., C2-A, B) of the plurality of capacitive structures having common interconnects (e.g., 230, 240). The capacitive structures of the first group are intertwined with the capacitive structures of the second group. As discussed above, the intertwining may be configured so every other capacitive structure is a member of the first group (e.g., forms the first capacitor) or the intertwining may be varied over the span (see, e.g., FIGS. 5C and 5D).

The intertwined capacitors may be formed on the substrate in a variety of different ways. For example, the substrate may be formed of a dielectric material, such as silicon dioxide, and the conductive elements may then be patterned and deposited on the substrate. An overlay layer of dielectric material may then be deposited over the conductive elements to fill in any gaps with dielectric material. Alternatively, a dielectric layer can be formed on a silicon substrate. A metal/conductive layer can deposited on the dielectric layer and patterned, e.g., using photolithography to form the interconnects and/or fingers of each capacitor. Alternatively, the interconnects may be deposited above and/or below the layer containing the fingers. For example, the interconnects can be formed on alternate layers to route interconnects across the span of the conductor without interfering with neighboring fingers or interconnects of other capacitors. The foregoing description is merely provided for illustration and embodiments of the invention are not limited to any particular process for forming the intertwined capacitors discussed herein.

Accordingly, another embodiment of the invention can include a method for making capacitors. The method can include forming a plurality of capacitive structures on a substrate. Each capacitive structure includes a first conductive finger, and a second conductive finger, wherein the first and second conductive fingers are arranged in parallel with each other and separated from each other by a dielectric material and wherein the first finger is connected to a first interconnect and the second conductive finger is connected to a second interconnect. A first capacitor is formed from a first group of the plurality of capacitive structures having common interconnects. A second capacitor is formed from a second group of the plurality of capacitive structures having common interconnects and the capacitive structures of the first group are intertwined with the capacitive structures of the second group.

Figures 5A, 5B, 5C, 5D:
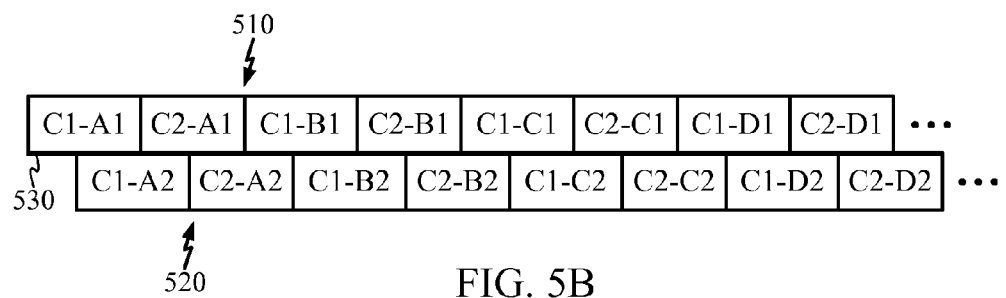
FIGS. 5A-D are block diagrams of alternate configurations of the intertwined capacitors.

Referring to FIG. 5A, a multilayered or stacked arrangement of intertwined, matched capacitor pairs may also be formed. For example, the capacitive arrangement 200 can be repeated by forming multiple layers of the arrangement. The individual capacitors within layers, and/or between layers, may be interconnected to form multiple capacitors in series and/or in parallel in a variety of combinations. The intertwined capacitors and fingers within each capacitor can be used to normalize process variations across the entire wafer. The fingers in any one layer may follow a pattern expressed as follows, where ∈ represents an insulating or dielectric layer between conductive fingers:

A1-∈-B1-∈-A2-∈-C1-∈-D1-∈-C2-∈-A3-∈-B2-∈-A4-∈-C3-∈-D2-∈-C4.

Referring to FIG. 5B, in another embodiment the capacitive structures of the first group (e.g., C1-A1, B1, etc.) in the first layer 510 are offset from capacitive structures of the first group (e.g., C1-A2, B2, etc.) in the second layer 520. Further, as illustrated, a third layer 530 may contain interconnects for each layer. Accordingly, another aspect of the invention may include the capacitive structures of the first group (e.g., C1-A1, B1, etc.) in the first layer 510 and the capacitive structures of the first group (e.g., C1-A2, B2, etc.) in the second layer 520 being connected to the same interconnects which is formed in the third layer 530 between the first 510 and second 520 layers. Thus a common interconnect (or bus) can be used to couple the capacitive structures (e.g., C1-A1, A2, etc.) in both layers (510, 520) that form a single capacitor (e.g., C1).

FIG. 5C illustrates an embodiment having the capacitive structures of the first group (e.g., C1-A, B, etc.) are intertwined with the capacitive structures of the second group (e.g., C2-A, B, etc.), such that every other capacitive structure is a member of the first group (e.g., C1-A, B, etc.). However, the size of the capacitive structures may be varied to allow for less intertwining. For example, capacitive structure C1-C may have more fingers than C1-A., which effectively reduces the intertwining of the capacitive structures and C1-C and C2-C are more subject to mismatch due to process variations. Likewise, in FIG. 5D a similar result is achieved by having the capacitive structures arranged so that the pattern is changed so that two structures (e.g., C1-C and C1-D) are adjacent each other. Accordingly, in embodiments of the invention, the intertwining can vary over the capacitive device (e.g., the matched pairs). As discussed above, an area that is known to have high variation would most likely have a higher degree of intertwining and areas having lower variation (e.g., due to process or materials) can have less intertwining, while still maintaining a highly matched capacitance between the two capacitors. The areas with less intertwining may facilitate routing, connection to other components and the like.

Accordingly, while there may still be systemic variations within a single capacitor, the resulting variations will be averaged out across the span of the wafer as the conductive pattern, e.g., in a photolithographic process, is repeated across the wafer. Once again, it will be appreciated that embodiments of the invention are not limited to the illustrated arrangements. For example, the layers in the stacked configuration may have a different sequence of capacitive structures, may be offset from the adjacent layer and/or may have more or less intertwining, as discussed above. Therefore, embodiments of the invention are not limited to the specific arrangements illustrated herein.

While the foregoing disclosure shows illustrative embodiments of the invention, it should be noted that various changes and modifications could be made herein without departing from the scope of the invention as defined by the appended claims. For example, the capacitive devices and structures discussed herein include matched capacitor pairs embedded in an integrated circuit. Accordingly, embodiments of the invention can include active elements (e.g., transistors) in combination with the capacitive structures. One such exemplary integrated circuit which uses matched capacitors and/or capacitors of specific ratios is a switched-capacitor integrator.

Further, the functions, steps and/or actions of methods in accordance with the embodiments of the invention described herein need not be performed in any particular order. Furthermore, although elements of the invention may be described or claimed in the singular, the plural is contemplated unless limitation to the singular is explicitly stated.

What is claimed is:

1. An integrated circuit, comprising:
  a plurality of capacitive structures formed on a substrate, wherein each capacitive structure includes:
    a first conductive finger, and
    a second conductive finger, wherein the first and second conductive fingers are arranged in parallel with each other and separated from each other by a dielectric material and wherein the first finger is connected to a first interconnect and the second conductive finger is connected to a second interconnect, wherein the first interconnect and second interconnect form a set of common interconnects, and wherein the first finger and the first interconnect are on separate layers, and the second finger and the second interconnect are on separate layers, wherein the first interconnect and second interconnect form different levels;
  a first capacitor formed from a first group of the plurality of capacitive structures having a first set of common interconnects; and
  a second capacitor formed from a second group of the plurality of capacitive structures having a second set of common interconnects,
  wherein the capacitive structures of the first group are intertwined with the capacitive structures of the second group.

2. The integrated circuit according to claim 1, wherein at least one of the plurality of capacitive structures includes:
  a third conductive finger, wherein the first, second and third conductive fingers are arranged in parallel with each other and separated from each other by a dielectric material and wherein the first and third conductive finger are connected through the first interconnect and the second conductive finger is connected to the second interconnect.

3. The integrated circuit according to claim 1, wherein the capacitive structures of the first group are intertwined with the capacitive structures of the second group, and every other capacitive structure is a member of the first group.

4. The integrated circuit according to claim 1, wherein the capacitive structures of the first group are intertwined with the capacitive structures of the second group, and at least two adjacent capacitive structures are members of the first group.

5. The integrated circuit according to claim 1, wherein the conductive fingers of each capacitive structure are in parallel with adjacent conductive fingers in adjacent capacitive structures.

6. The integrated circuit according to claim 5, wherein a separation between conductive fingers of adjacent capacitive structures is greater than the separation between the conductive fingers within each capacitive structure.

7. The integrated circuit according to claim 1, wherein each of the conductive fingers has a width proportional to a characteristic dimension of a systemic variation of a process and/or material used to form the capacitive structures.

8. The integrated circuit according to claim 7, wherein each of the conductive fingers has a width of one micron or less.

9. The integrated circuit according to claim 1, further comprising:
a third capacitor formed from a third group of the plurality of capacitive structures having respective interconnects coupled together, wherein the capacitive structures of the first group, the second group and the third group are each intertwined with the other.

10. The integrated circuit according to claim 1, wherein the capacitive structures are connected to form a matched capacitor pair.

11. The integrated circuit according to claim 10, wherein the matched capacitor pair is coupled to at least one active element.

12. The integrated circuit according to claim 1, wherein the dielectric material is formed from the substrate.

13. The integrated circuit according to claim 1, wherein the first group and the second group are formed in a first and second layer, and wherein the first group and second group are intertwined on each of the first and second layers.

14. The integrated circuit according to claim 13, wherein the capacitive structures of the first group in the first layer are offset from capacitive structures of the first group in the second layer.

15. The integrated circuit according to claim 13, wherein the capacitive structures of the first group in the first layer and the capacitive structures of the first group in the second layer are connected to the same interconnects which are located between the first and second layers.

16. A method for making capacitors, the method comprising:
forming a plurality of capacitive structures on a substrate, wherein each capacitive structure includes:
a first conductive finger, and
a second conductive finger, wherein the first and second conductive fingers are arranged in parallel with each other and separated from each other by a dielectric material and wherein the first finger is connected to a first interconnect and the second conductive finger is connected to a second interconnect, and wherein the first interconnect and second interconnect form a set of common interconnects, and wherein the first finger and the first interconnect are on separate layers, and the second finger and the second interconnect are on separate layers, wherein the first interconnect and second interconnect form different levels;
forming a first capacitor from a first group of the plurality of capacitive structures having a first set of common interconnects;
forming a second capacitor from a second group of the plurality of capacitive structures having a second set of common interconnects; and
intertwining the capacitive structures of the first group with the capacitive structures of the second group.

17. The method of claim 16, further comprising:
arranging adjacent capacitive structures to form a separation between conductive fingers of the adjacent capacitive structures that is greater than the separation between the conductive fingers within each capacitive structure.

18. The method of claim 16, wherein intertwining further comprises:
intertwining the capacitive structures at different rates, wherein at least a portion of the capacitive structures from the first group are adjacent each other.

19. An integrated circuit, comprising:
a plurality of capacitive structures formed on a substrate, wherein each capacitive structure includes:
a first conductive finger, and
a second conductive finger, wherein the first and second conductive fingers are arranged in parallel with each other and separated from each other by a dielectric material and wherein the first finger is connected to a first interconnect and the second conductive finger is connected to a second interconnect, wherein the first interconnect and second interconnect form a set of common interconnects, and wherein the first finger and the first interconnect are on separate layers, and the second finger and the second interconnect are on separate layers;
a first capacitor formed from a first group of the plurality of capacitive structures having a first set of common interconnects; and
a second capacitor formed from a second group of the plurality of capacitive structures having a second set of common interconnects,
wherein the capacitive structures of the first group are intertwined with the capacitive structures of the second group.

* * * * *